United States Patent
Sugiura

(10) Patent No.: US 9,800,156 B2
(45) Date of Patent: Oct. 24, 2017

(54) AMPLIFIER CIRCUIT AND VOLTAGE REGULATOR

(71) Applicant: SII Semiconductor Corporation, Chiba-shi, Chiba (JP)

(72) Inventor: Masakazu Sugiura, Chiba (JP)

(73) Assignee: SII SEMICONDUCTOR CORPORATION, Chiba (JP)

(*) Notice: Subject to any disclaimer, the term of this patent is extended or adjusted under 35 U.S.C. 154(b) by 0 days.

(21) Appl. No.: 15/367,840

(22) Filed: Dec. 2, 2016

(65) Prior Publication Data
US 2017/0170730 A1    Jun. 15, 2017

(30) Foreign Application Priority Data

Dec. 11, 2015  (JP) ................................ 2015-242546

(51) Int. Cl.
*H02M 3/158*    (2006.01)
*H03F 1/34*    (2006.01)

(52) U.S. Cl.
CPC ............ *H02M 3/158* (2013.01); *H03F 1/342* (2013.01); *H03F 2200/69* (2013.01)

(58) Field of Classification Search
CPC ..... H02M 3/158; H03F 1/342; H03F 2200/69
USPC .......... 323/271–281, 311–316; 327/538–546
See application file for complete search history.

(56) References Cited

U.S. PATENT DOCUMENTS

| | | | | |
|---|---|---|---|---|
| 4,947,063 A * | 8/1990 | O'Shaughnessy ... | H03K 17/163 | 326/103 |
| 5,363,063 A * | 11/1994 | Laot ........................ | H03F 1/523 | 333/264 |
| 5,519,357 A * | 5/1996 | Eddlemon ............. | H03F 3/3001 | 330/264 |
| 9,639,101 B2 * | 5/2017 | Suzuki ...................... | G05F 1/56 | |
| 2012/0146603 A1* | 6/2012 | Heng ...................... | G05F 1/575 | 323/282 |
| 2013/0033247 A1* | 2/2013 | Endo ...................... | G05F 1/575 | 323/282 |
| 2015/0055257 A1* | 2/2015 | Azuma .................. | H02H 9/025 | 361/18 |
| 2016/0342171 A1* | 11/2016 | Tomioka ................. | G05F 3/262 | |

FOREIGN PATENT DOCUMENTS

JP           07-183736           7/1995

OTHER PUBLICATIONS

Received STIC search report from EIC 2800 searcher John DiGeronimo on Jun. 2, 2017.*

* cited by examiner

*Primary Examiner* — Timothy J Dole
*Assistant Examiner* — Htet Z Kyaw
(74) *Attorney, Agent, or Firm* — Brinks Gilson & Lione

(57) ABSTRACT

Provided are an amplifier circuit capable of improving phase characteristics, and a voltage regulator including the amplifier circuit. The amplifier circuit is configured to amplify an input voltage and to output the input voltage, and includes a current source, a first transistor having a gate to which the input voltage is applied, and a second transistor having a gate to which a voltage synchronous with the input voltage is applied, and a source connected to a capacitor.

6 Claims, 5 Drawing Sheets

AMPLIFIER CIRCUIT AND VOLTAGE REGULATOR

RELATED APPLICATIONS

This application claims priority under 35 U.S.C. §119 to Japanese Patent Application No. 2015-242546 filed on Dec. 11, 2015, the entire content of which is hereby incorporated by reference.

BACKGROUND OF THE INVENTION

1. Field of the Invention

The present invention relates to an amplifier circuit capable of improving phase characteristics, and a voltage regulator including the amplifier circuit.

2. Description of the Related Art

FIG. 5 is a circuit diagram of a related-art negative feedback amplifier circuit.

A related-art negative feedback amplifier circuit 500 includes an amplifier circuit 510, which is a common source amplifier circuit, and an amplifier circuit 520. The amplifier circuit 510 includes a current source 511 and an NMOS transistor 512, which are connected in series.

The amplifier circuit 510 has an output connected to an input of the amplifier circuit 520. The amplifier circuit 520 has an output connected to a gate of the NMOS transistor 512 of the amplifier circuit 510.

The amplifier circuit 510 is configured to amplify, based on a drive current of the NMOS transistor 512, a voltage input to the amplifier circuit 510 and to output the amplified voltage. The amplifier circuit 520 is configured to amplify an output voltage V1$a$ of the amplifier circuit 510 and to output the amplified voltage. A feedback voltage V2 generated by the amplifier circuit 520 is input to the amplifier circuit 510.

Therefore, the negative feedback amplifier circuit 500 is configured to operate so as to maintain an operating point at a constant value. For example, the output voltage V1$a$ of the amplifier circuit 510 and the output voltage V2 of the amplifier circuit 520 may be maintained at a constant value by causing the drive current of the NMOS transistor 512 to be approximately equal to a current of the current source 511 (see, for example, Japanese Patent Application Laid-open No. Hei 7-183736).

However, in the related-art negative feedback amplifier circuit 500, there is a problem in that a phase of a feedback voltage is delayed due to a pole appearing in output of an amplifier circuit, and that a negative feedback circuit thus has a high risk of oscillating.

A frequency at which the pole appears is affected by a load capacitance and a load resistance. For example, when the load capacitance is small and the load resistance is small, the pole appears at a high frequency and causes a phase delay. Further, for example, when the load capacitance is large and the load resistance is large, the pole appears at a low frequency and causes a phase delay. Here, conditions of the load capacitance or the load resistance differ depending on an application.

In order for the negative feedback circuit to have a lower risk of oscillating, it is important to correctly know the frequency at which the pole appears and take measures based on the conditions of the load capacitance or the load resistance of the application to be faced.

SUMMARY OF THE INVENTION

The present invention has been made in order to solve the above-mentioned problem, and provides an amplifier circuit capable of improving phase characteristics, and a voltage regulator including the amplifier circuit.

In order to solve the related-art problem, according to one embodiment of the present invention, there are provided an amplifier circuit and a voltage regulator including the amplifier circuit having the following configurations.

That is, the amplifier circuit is configured to amplify a voltage input to an input terminal and to output the amplified voltage to an output terminal, and includes: a current source; a first transistor including a gate connected to the input terminal; a second transistor including a drain connected to the current source, a source connected to the drain of the first transistor, and a gate connected to the input terminal; and a capacitor including one terminal connected to the source of the second transistor, the drain of the second transistor being connected to the output terminal.

Further, the voltage regulator includes the amplifier circuit.

According to the amplifier circuit capable of improving the phase characteristics, and the voltage regulator including the amplifier circuit of the present invention, there is provided a signal propagation path formed by the capacitor configured to generate a phase lead current. As a result, the phase delay of the feedback voltage may be alleviated. Thus, there can be provided the amplifier circuit capable of lowering a risk that the negative feedback circuit may oscillate and improving the phase characteristics, and the voltage regulator including the amplifier circuit.

DETAILED DESCRIPTION OF THE PREFERRED EMBODIMENTS

Figure 1:
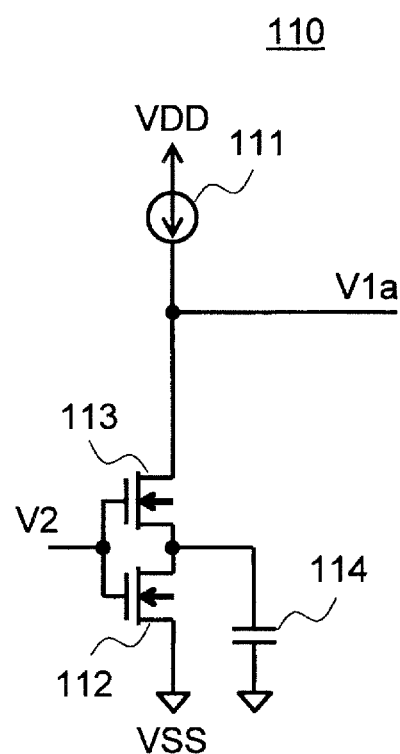
FIG. 1 is a circuit diagram for illustrating an example of an amplifier circuit according to an embodiment of the present invention.

FIG. 1 is a circuit diagram for illustrating an example of an amplifier circuit according to an embodiment of the present invention.

In FIG. 1, an amplifier circuit 110 of this embodiment includes a current source 111, NMOS transistors 112 and 113, and a capacitor 114.

The NMOS transistor 112 has a source connected to a ground terminal (VSS), and a gate connected to an input terminal of the amplifier circuit 110. The NMOS transistor 113 has a source connected to a drain of the NMOS transistor 112, and a gate connected to the input terminal of the amplifier circuit 110. The current source 111 is connected between a power supply terminal (VDD) and a drain of the NMOS transistor 113. The capacitor 114 is connected between the source of the NMOS transistor 113 and the ground terminal. The amplifier circuit 110 has an output terminal connected to the drain of the NMOS transistor 113.

An operation of the amplifier circuit 110 of this embodiment is described.

A voltage V2, which is an input voltage of the amplifier circuit 110, is applied to the gate of the NMOS transistor 112. A voltage between the gate and the source of the NMOS transistor 112 is a voltage synchronous with the voltage V2, and thus the NMOS transistor 112 causes a current depending on the voltage V2 to flow.

The voltage V2 is also applied to the gate of the NMOS transistor 113. The NMOS transistor 113 is a so-called source follower transistor, and thus a voltage synchronous with the voltage V2 appears at the source thereof. A current generated at the capacitor 114 leads in phase compared to a voltage applied to the capacitor 114. Therefore, a current that leads in phase compared to the voltage V2 flows through the capacitor 114, to which the voltage synchronous with the voltage V2 is applied.

The amplifier circuit 110 is configured to amplify, based on a current obtained by adding a current driven by the NMOS transistor 112 and a current that passes through the capacitor 114 together, the input voltage V2 and to output the amplified voltage V2 as a voltage V1a.

When a frequency of the capacitor becomes higher, impedance thereof becomes lower. Therefore, the current that passes through the capacitor 114 becomes larger when a frequency thereof becomes higher. When a frequency of the voltage V2 becomes higher, the current passing through the capacitor 114, which leads in phase compared to the voltage V2, becomes relatively larger, and thus the voltage V1a leads in phase.

Therefore, when the amplifier circuit of this embodiment is used in a negative feedback amplifier circuit, a phase delay of the feedback voltage (voltage V2) is alleviated, that is, a phase compensation effect is obtained, and a stable negative feedback amplifier circuit can be formed.

As described above, according to the amplifier circuit of this embodiment, a signal propagation path is formed by the capacitor configured to generate the phase lead current. Therefore, in the negative feedback amplifier circuit including the amplifier circuit, the phase delay of the feedback voltage can be alleviated, and the phase characteristics can be improved. As a result, the negative feedback amplifier circuit (for example, voltage regulator) including the amplifier circuit can have a lower risk of oscillating, and thus can stably operate.

As long as the current source 111 is an element serving as a load in the amplifier circuit 110, the current source 111 does not need to be limited to an actual current source. For example, the current source 111 may be selected from available elements, e.g., a resistor, as appropriate.

Figure 2:
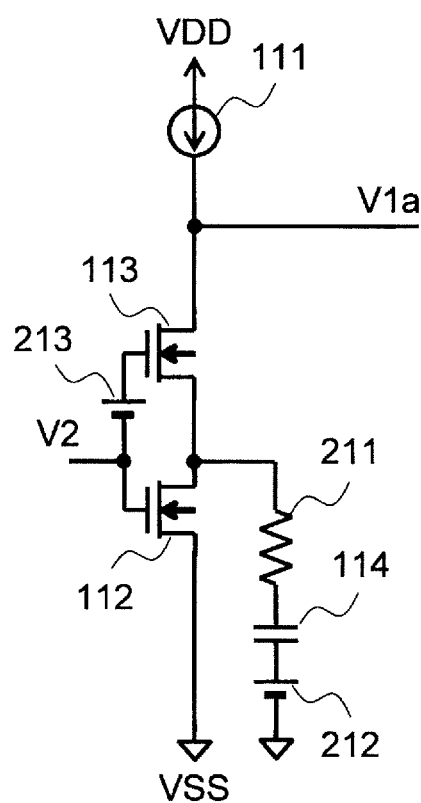
FIG. 2 is a circuit diagram for illustrating another example of the amplifier circuit according to this embodiment.

Further, as illustrated in FIG. 2, the capacitor 114 may be connected to a resistor 211 in series. In this case, the current passing through the capacitor 114 is restricted by the resistor 211. As a result, an effect of restricting a bandwidth may be expected in an amplifier circuit 210, and there is provided an advantage that an amplifier circuit with a good high-frequency noise resistance characteristic may be realized.

Further, the capacitor 114 is configured to be connected to the ground terminal, but the same effect may be obtained even when the capacitor 114 is connected to a voltage source 212 that is based on a voltage of the ground terminal as illustrated in FIG. 2. For example, a voltage of the voltage source 212 may be the same as a voltage of the power supply terminal.

Further, the gate of the NMOS transistor 113 may be connected to a voltage source 213, which is arranged between the input terminal of the amplifier circuit and the gate of the NMOS transistor 113. That is, it is apparent that the same effect may be obtained even when a voltage synchronous with the voltage obtained by adding the voltage of the voltage source 213 to the input voltage V2 of the amplifier circuit appears at the source of the NMOS transistor 113. Further, the voltage source 213 may be connected between the input terminal of the amplifier circuit and the gate of the NMOS transistor 112.

Further, in the above description, the amplifier circuit of this embodiment is described on the assumption that the NMOS transistor is used. However, even for an amplifier circuit formed on the assumption that a PMOS transistor is used, the phase characteristics can be improved by similarly forming the signal propagation path by the capacitor configured to generate the phase lead current. Therefore, the negative feedback amplifier circuit (for example, voltage regulator) including the amplifier circuit can have a lower risk of oscillating, and thus can stably operate.

Figure 3:
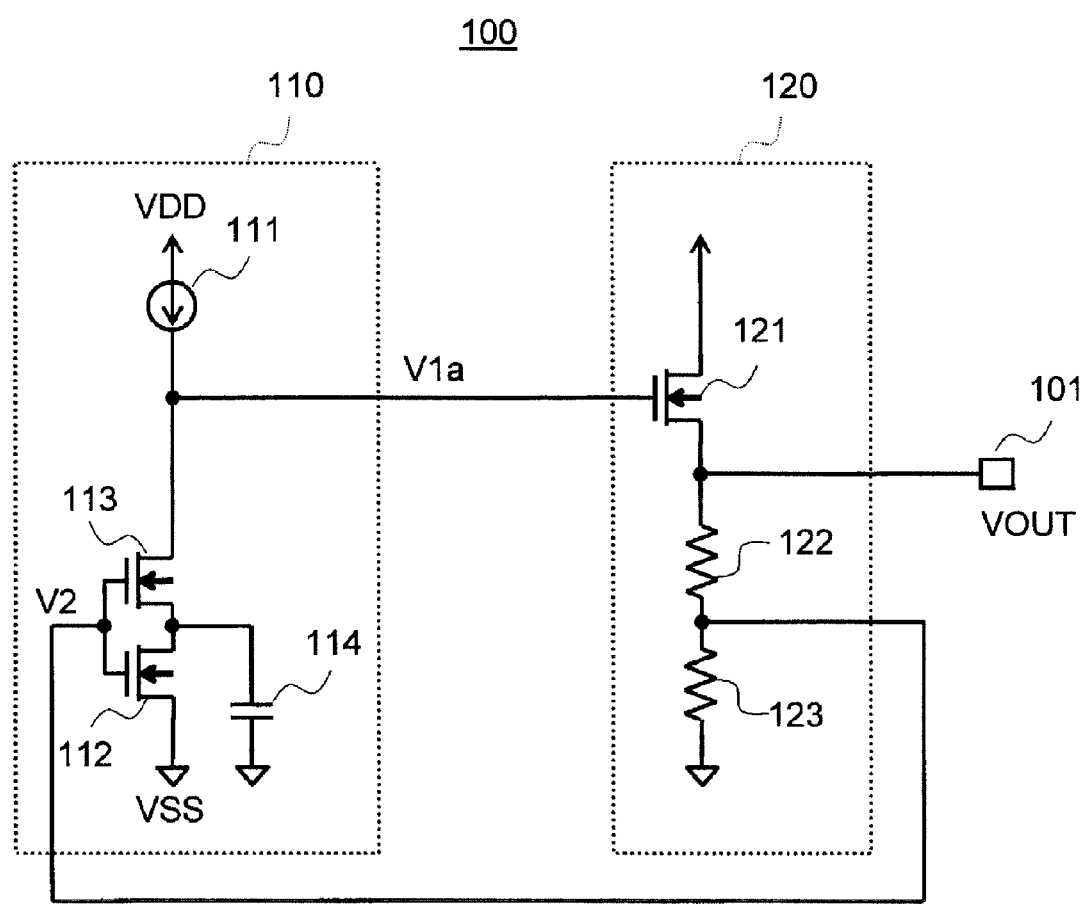
FIG. 3 is a circuit diagram of a voltage regulator including the amplifier circuit according to this embodiment.

Next, description is made of an example of a voltage regulator including the amplifier circuit of this embodiment, which is illustrated in FIG. 3.

A voltage regulator 100 includes the amplifier circuit 110 illustrated in FIG. 1, an amplifier circuit 120, and an output terminal 101. The amplifier circuit 120 includes an NMOS transistor 121, a resistor 122, and a resistor 123.

The output terminal of the amplifier circuit 110 is connected to an input terminal of the amplifier circuit 120. The amplifier circuit 120 has an output terminal connected to the output terminal 101 of the voltage regulator 100, and a feedback-voltage output terminal connected to the input terminal of the amplifier circuit 110.

The NMOS transistor 121, the resistor 122, and the resistor 123 are connected in series between the power supply terminal and the ground terminal. The NMOS transistor 121 has a gate connected to the input terminal of the amplifier circuit 120, and a source connected to the output terminal of the amplifier circuit 120. A node between the resistor 122 and the resistor 123 is connected to the feedback-voltage output terminal of the amplifier circuit 120.

Next, an operation of the voltage regulator 100 is described.

The amplifier circuit 120 is configured to perform, based on the input voltage V1a, an amplifying operation and to output an amplified voltage VOUT. Further, the amplifier circuit 120 is configured to divide the voltage VOUT by the resistor 122 and the resistor 123 and to output the voltage V2, which is a feedback voltage, to the input terminal of the amplifier circuit 110. Therefore, the input terminals and the output terminals of the amplifier circuit 110 and the amplifier circuit 120 are connected to each other, and thus the amplifier circuit 110 and the amplifier circuit 120 form a negative feedback amplifier circuit. When the voltage VOUT becomes lower, that is, when the voltage V2, which is the feedback voltage, becomes lower, the following occurs. In the amplifier circuit 110, the NMOS transistors 112 and 113 are turned off, and thus the voltage V1a output from the amplifier circuit 110 becomes higher. In the amplifier circuit 120, the NMOS transistor 121 is turned on, and thus the voltage VOUT output from the amplifier circuit 120 becomes higher. Further, when the voltage VOUT becomes higher, that is, when the voltage V2, which is the feedback voltage, becomes higher, the following occurs. In the amplifier circuit 110, the NMOS transistors 112 and 113 are turned on, and thus the voltage V1a output from the amplifier circuit 110 becomes lower. In the amplifier circuit 120, the NMOS transistor 121 is turned off, and thus the voltage VOUT output from the amplifier circuit 120 becomes lower. That is, the voltage regulator 100 is operated so as to maintain the voltage VOUT at a constant level.

In the description of the embodiment in FIG. 1, in regard to the amplifier circuit 110, the effect that may alleviate the phase delay of the feedback voltage is clarified. Therefore, in the voltage regulator 100, which is a negative feedback amplifier circuit including the amplifier circuit 110 of this embodiment, the phase delay of the feedback voltage may be alleviated, and thus the voltage regulator 100 can stably operate.

The same effect may be obtained even when the voltage regulator 100 has a circuit configuration as, for example, the amplifier circuit 210 as described above.

Figure 4:
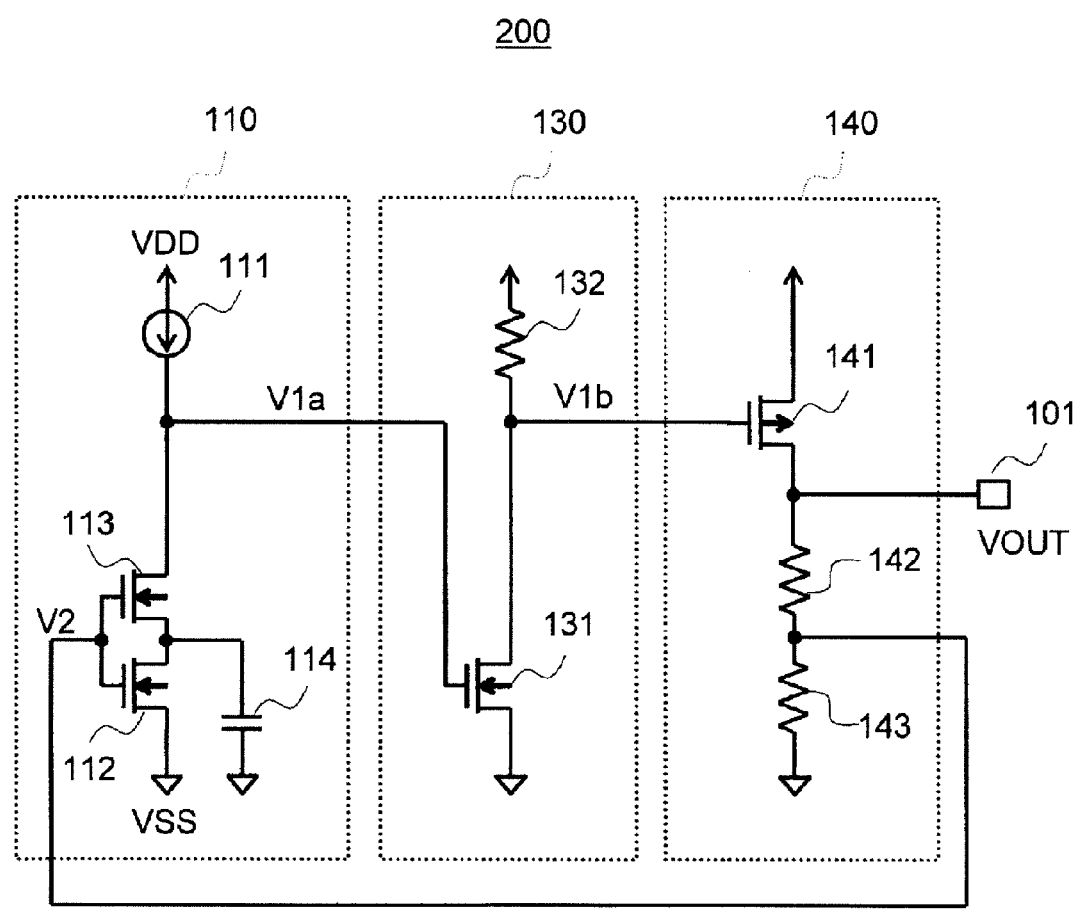
FIG. 4 is a circuit diagram for illustrating another example of the voltage regulator including the amplifier circuit according to this embodiment.
Figure 5:
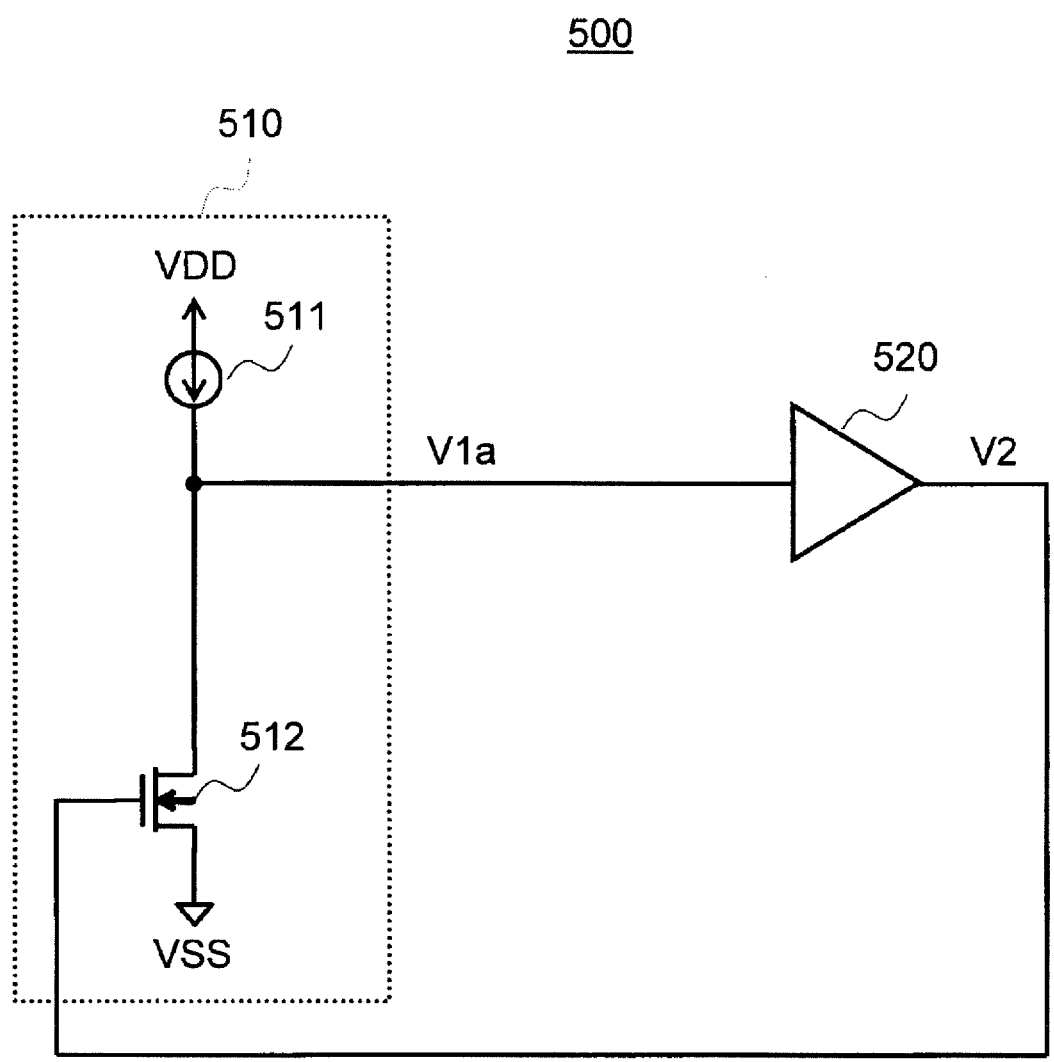
FIG. 5 is a circuit diagram of a related-art negative feedback amplifier circuit.

FIG. 4 is a circuit diagram for illustrating another example of the voltage regulator including the amplifier circuit according to this embodiment.

A voltage regulator 200 includes the amplifier circuit 110, an amplifier circuit 130, an amplifier circuit 140, and the output terminal 101.

The amplifier circuit 130 includes an NMOS transistor 131 and a resistor 132. The amplifier circuit 140 includes a PMOS transistor 141, a resistor 142, and a resistor 143.

The voltage regulator 200 includes the amplifier circuit 140 including the PMOS transistor 141, and thus includes the amplifier circuit 130 configured to invert an amplification polarity of the voltage V1a output from the amplifier circuit 110.

The voltage regulator 200 configured as above forms a negative feedback amplifier circuit similarly to the voltage regulator 100, and thus it is apparent that the same effect may be obtained therefrom.

As described above, according to the amplifier circuit of this embodiment, it is possible to improve the phase characteristics. Therefore, in the voltage regulator, which is the negative feedback amplifier circuit including the amplifier circuit, the phase delay of the feedback voltage may be alleviated. Thus, the voltage regulator that can have a lower risk of oscillating, that is, the voltage regulator that stably operates can be provided.

What is claimed is:

1. An amplifier circuit, which is configured to amplify a voltage input to an input terminal and to output the amplified voltage to an output terminal, the amplifier circuit comprising:
   a current source;
   a first transistor including a gate connected to the input terminal;
   a second transistor including a drain connected to the current source, a source connected to the drain of the first transistor, and a gate connected to the input terminal; and
   a capacitor including one terminal connected to the source of the second transistor,
   the drain of the second transistor being connected to the output terminal.

2. An amplifier circuit according to claim 1, wherein the current source comprises a resistor element.

3. An amplifier circuit according to claim 1, further comprising a voltage source on another-terminal side of the capacitor.

4. An amplifier circuit according to claim 1, further comprising a resistor element, which is connected to the capacitor in series.

5. An amplifier circuit according to claim 1, further comprising a voltage source between the gate of the first transistor and the gate of the second transistor.

6. A voltage regulator, comprising the amplifier circuit of claim 1.

* * * * *